(12) United States Patent
Tsai et al.

(10) Patent No.: US 9,048,127 B2
(45) Date of Patent: Jun. 2, 2015

(54) THREE DIMENSIONAL CIRCUIT INCLUDING SHIELDED INDUCTOR AND METHOD OF FORMING SAME

(71) Applicant: Taiwan Semiconductor Manufacturing Co., Ltd., Hsin-Chu (TW)

(72) Inventors: Ming-Hsien Tsai, New Taipei (TW); Hsieh-Hung Hsieh, Taipei (TW); Tzu-Jin Yeh, Hsinchu (TW); Chewn-Pu Jou, Chutung (TW); Sa-Lly Liu, HsinChu (TW); Fu-Lung Hsueh, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/035,979

(22) Filed: Sep. 25, 2013

(65) Prior Publication Data
US 2015/0084158 A1    Mar. 26, 2015

(51) Int. Cl.
| H01L 27/08 | (2006.01) |
| H01L 49/02 | (2006.01) |
| H01L 23/538 | (2006.01) |
| H01L 23/58 | (2006.01) |
| H01L 27/06 | (2006.01) |

(52) U.S. Cl.
CPC ............ *H01L 28/10* (2013.01); *H01L 23/5384* (2013.01); *H01L 23/585* (2013.01); *H01L 27/0688* (2013.01)

(58) Field of Classification Search
None
See application file for complete search history.

(56) References Cited

U.S. PATENT DOCUMENTS

| 7,037,800 | B2 * | 5/2006 | Pyo ............................... 438/381 |
| 7,312,487 | B2 * | 12/2007 | Alam et al. .................... 257/278 |
| 7,541,644 | B2 * | 6/2009 | Hirano et al. ................. 257/347 |
| 7,662,722 | B2 * | 2/2010 | Stamper et al. ............... 438/719 |
| 7,741,645 | B2 * | 6/2010 | Zhu ................................ 257/67 |
| 7,799,675 | B2 * | 9/2010 | Lee ................................ 438/637 |
| 7,947,599 | B2 * | 5/2011 | Chen et al. .................... 438/662 |
| 7,960,242 | B2 | 6/2011 | Or-Bach et al. |
| 8,067,816 | B2 * | 11/2011 | Kim et al. ..................... 257/531 |
| 8,362,591 | B2 | 1/2013 | Yen et al. |
| 2003/0155923 | A1 * | 8/2003 | Omeragic et al. ............ 324/338 |
| 2007/0257339 | A1 * | 11/2007 | Chen et al. .................... 257/665 |
| 2012/0034774 | A1 * | 2/2012 | Anthony et al. .............. 438/622 |

(Continued)

OTHER PUBLICATIONS

Liu, C. et al, "A Design Tradeoff Study with Monolithic 3D Integration", A Scholarly Paper—Georgia Institute of Technology, Atlanta, Georgia, retrieved from www.gtcad.gatech.edu/www/papers/isqed12-1. 8 pages.

(Continued)

*Primary Examiner* — Evan Pert
*Assistant Examiner* — Herve Assouman
(74) *Attorney, Agent, or Firm* — Duane Morris LLP

(57) ABSTRACT

The three dimensional (3D) circuit includes a first tier including a semiconductor substrate, a second tier disposed adjacent to the first tier, a three dimensional inductor including an inductive element portion, the inductive element portion including a conductive via extending from the first tier to a dielectric layer of the second tier. The 3D circuit includes a ground shield surrounding at least a portion of the conductive via. In some embodiments, the ground shield includes a hollow cylindrical cage. In some embodiments, the 3D circuit is a low noise amplifier.

19 Claims, 5 Drawing Sheets

(56) References Cited

U.S. PATENT DOCUMENTS

2012/0187530 A1\* 7/2012 Zhang et al. ............. 257/531
2012/0217624 A1\* 8/2012 Morris et al. ............. 257/659

OTHER PUBLICATIONS

Athreya, D., "High Q Inductors on Ultra Thin Organic Substrates", A Thesis Paper, Georgia Institute of Technology, Aug. 2008, 90 pages.

Kang, U. et al., "8 Gb 3-D DDR3 DRAM Using Through-Silicon-Via Technology", IEEE Journal of Solid-State Circuits, Jan. 2010, 45(1):111-119.

Kim, J. et al., "High-Frequency Scalable Electrical Model and Analysis of a Through Silicon Via (TSV)", IEEE Transactions on Components, Packaging, and Manufacturing Technology, Feb. 2011, 1(2):181-195.

Mingzhu, Z., "A Low Phase Noise Wideband VCO in 65nm RF COMS for Lower Power Applications", A Scholarly Paper published in 2012 International Conference on Microwave and Millimeter Wave Technology (ICMMT), vol. 1, May 2012, 4 pages.

Tanabe, A. et al., "A Novel Variable Inductor Using a Bridge Circuit and Its Application to a 5-20 GHz Tunable LC-VCO", IEEE Journal of Solid-State Circuits, Apr. 2011, 46(4):883-893.

\* cited by examiner

THREE DIMENSIONAL CIRCUIT INCLUDING SHIELDED INDUCTOR AND METHOD OF FORMING SAME

FIELD OF THE INVENTION

The present disclosure is directed generally to integrated circuits. In particular, the present disclosure relates to integrated circuit structures including circuits including shielded inductors and methods of forming such shielded inductors.

DESCRIPTION OF THE RELATED ART

Developments in integrated circuit technology have often focused on improving the integration density of various electronic components (e.g. transistors, capacitors, diodes, resistors, inductors, etc.) into a given chip or wafer area. Various improvements have involved the reduction of minimum component size, permitting more components to be integrated on the surface of the semiconductor die. Such two-dimensional (2D) integration density improvements are physically limited by device size, the size of the die, and other limitations including the complexity of design, such as, for example, the requisite length and number of interconnections between devices, and the corresponding circuit delay and power consumption increases.

Three-dimensional (3D) integrated circuits (3DIC) and stacked wafers or dies are used to resolve some of the limitations of 2D integrated circuits. Plural dies are stacked vertically within a single package and electrically connected to each other. Through substrate vias (also referred to as through silicon vias), TSVs, are often used in stacked wafer/die packaging structures to connect the wafers or dies. TSVs are vertical openings passing completely though semiconductor substrates and filled with conductive material to provide connections between stacked wafers or dies. The total interconnect length of the integrated circuits has been found to decrease as the number of dies or wafers increased in the 3D stack.

In Radio Frequency (RF) communication systems, such as cellular telephony, cordless phone, wireless data networks, two way paging, global positioning systems (GPS), etc., stringent specifications are placed on the system such as low phase noise, low power consumption and wide tuning range. In high speed and high frequency circuits, further consideration to noise coupling, electromagnetic interference, and crosstalk should be considered.

BRIEF DESCRIPTION OF THE DRAWINGS

Various aspects of the present disclosure will be or become apparent to one with skill in the art by reference to the following detailed description when considered in connection with the accompanying exemplary non-limiting embodiments.

DETAILED DESCRIPTION OF THE EMBODIMENTS OF THE INVENTION

Figure 1:
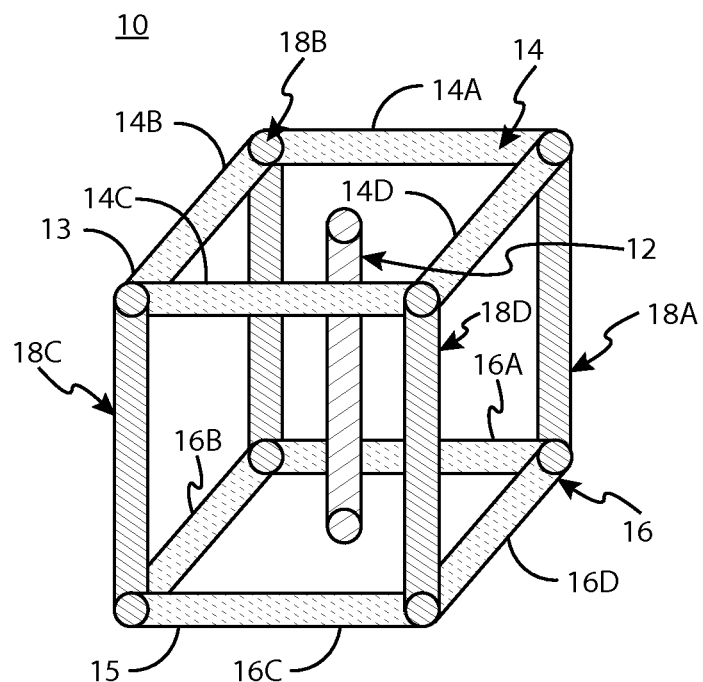
FIG. 1 is a three-dimensional view of a shielded 3-D inductor in accordance with an embodiment of the present disclosure.

In some embodiments described herein, a shielded inductor is included in a three-dimensional integrated circuit (3D IC) having a semiconductor substrate and a second tier dielectric layer above the semiconductor substrate. The shielded inductor includes at least one inter-tier via (also referred to as an inter-layer via (ILV)) extending completely through the second tier dielectric layer that forms an inductive element portion. In some embodiments, the shielded inductor includes one or more first conductive lines between the semiconductor substrate and the second tier dielectric layer, and one or more second conductive lines above the second tier dielectric layer. Each of the first conductive lines and each of the second conductive lines can connect to the inter-tier via. A grounded shield or cage can be formed around the inductive element using additional conductive vias coupled to ground.

Three dimensional integrated circuits (3D ICs) are implemented in a number of ways. One approach is to build stacked tiers over a single semiconductor wafer or substrate. 3D integration techniques form two or more tiers (any of which can include an active device layer), sequentially over a single semiconductor substrate (rather than fabricating each die separately and bonding two fabricated dies together using bumps or TSVs). The bottom tier includes the semiconductor substrate, which can contain active devices, and an interconnect structure above the substrate. Each upper tier has a respective layer of semiconductor (e.g., silicon) or dielectric (e.g., $SiO_2$, SiON, SiN, low-k dielectric or the like) formed above the semiconductor substrate (bottom tier) and above the interconnect structure of the bottom tier. In some embodiments, one or more upper tier(s) comprises a semiconductor layer (e.g., silicon), which can include transistors or other active devices therein. Each upper tier can include a respective interconnect structure (including plural inter-metal dielectric (IMD) layers with conductive lines and local vias therein) over the upper tier active device layer or dielectric layer. Inter-tier vias provide connections between devices and/or nodes in respectively different tiers.

Note the conductive vias described herein can take a number of forms including local vias, inter-tier vias, and through substrate or through silicon vias (TSVs). Local vias are generally conductive vias within a substrate layer or tier and can connect, for example, one metallization layer to another (e.g., M1 to M2, or M3 to M5) within a given interconnect structure or tier. An inter-tier via is a conductive via coupling a device in one tier of a 3D IC to another device in another tier of the 3D IC. In other words, an inter-tier via is a conductive via connecting one tier to another tier where each tier within a 3D IC can include an active device layer. A TSV is a conductive via that passes completely through the substrate, from the active face to the back face. Examples of most of these conductive vias are discussed below in the description of FIGS. 4B, 5B, 6 and 7.

Figure 2:
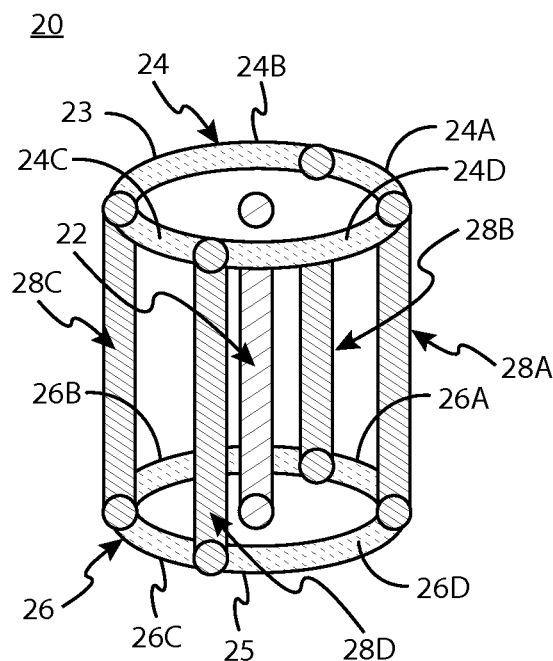
FIG. 2 is a three-dimensional view of another shielded 3-D inductor in accordance with an embodiment of the present disclosure.

FIG. 1 is a three-dimensional isometric view of a 3-D shielded inductor 10 having rectangular rings 14 and 16 forming a part of a rectangular cage ground shield having inductor portion 12, and FIG. 2 is a three-dimensional isometric view of a 3-D shielded inductor 20 with circular rings 24 and 26 forming part of a hollow-cylindrical cage ground shield having inductor portion 22. In FIG. 1, the rectangular ring 14 can be formed from conductive lines or segments 14A, 14B, 14C and 14D formed on a top tier 13 of a 3D IC, and the rectangular ring 16 can be formed from conductive lines or segments 16A, 16B, 16C and 16D formed on a bottom tier 15 of the 3D IC. In some embodiments, the rectangular ring 14 is coupled to the rectangular ring 16 using at least two inter-tier vias. For example, four inter-tier vias, such as conductive vias 18A, 18B, 18C, and 18D, are illustrated in FIG. 1 although fewer or more inter-tier vias can be implemented in some embodiments. Similarly, in FIG. 2, the ring 24 can be formed from conductive lines or segments 24A, 24B, 24C and 24D formed on a top tier 23 of a 3D IC, and the ring 26 can be formed from conductive lines or segments 26A, 26B, 26C and 26D formed on a bottom tier 25 of the 3D IC. In some embodiments, the ring 24 is coupled to the ring 26 using at least two inter-tier vias. For example, four inter-tier vias, such as conductive vias 28A, 28B, 28C, and 28D, are shown in FIG. 2, although fewer or more inter-tier vias can be used.

Figure 3:
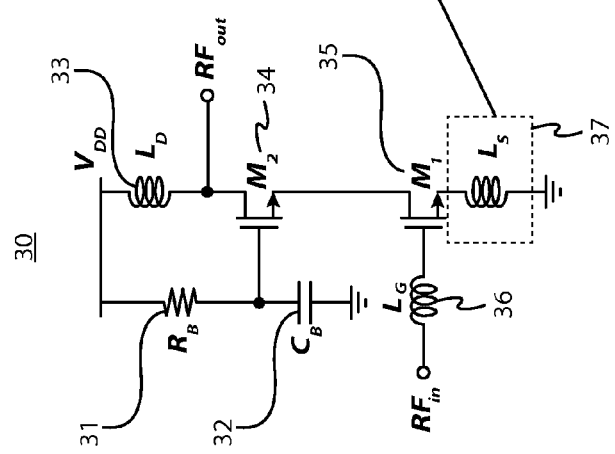
FIG. 3 is a circuit diagram illustrating a low-noise amplifier using a shielded 3-D inductor in accordance with an embodiment of the present disclosure.

The shielded inductors can be implemented in a number of circuits embodied in a 3D IC. Such circuits can include any number of different radio frequency or high speed circuits such as low noise amplifiers (LNAs), equalizer circuits, or impedance matching networks, for example. FIG. 3 is a schematic circuit diagram of a low-noise amplifier (LNA) 30 including a source inductor 37 ($L_S$) coupled to the source of a transistor 35 (M1). Source inductor 37 can be implemented as a 3-D shielded inductor, such as shielded inductor 10 illustrated in FIG. 1 or shielded inductor 20 illustrated in FIG. 2. The LNA 30 includes a gate inductor 36 ($L_G$) coupled between an RF input node, $RF_{in}$, and a gate of the transistor 35. The drain of transistor 35 couples to a source of another transistor 34 (M2). The drain of transistor 34 serves as the RF output node, $RF_{out}$, of the LNA 30 and further couples to drain inductor 33 ($L_D$). Drain inductor 33 also couples to Vdd. A resistor 31 is coupled between Vdd, the gate of transistor 34, and a capacitor 32, which is also coupled to ground. Note, in some embodiments, the gate inductor 36 and the drain inductor 33 are implemented as shielded 3-D inductors.

Figure 4A:
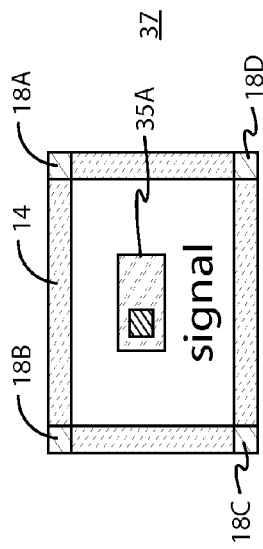
FIG. 4A is a partial top view of the shielded 3-D inductor for the low-noise amplifier of FIG. 3 in accordance with an embodiment of the present disclosure.

FIG. 4A illustrates a top plan view of the (source) inductor 37 as part of a 3D IC 40. As shown in FIG. 4A, 3-D shielded inductor 37 includes rectangular metal ring 14 and conductive vias 18A-D as shown in FIG. 1. The 3-D shielded inductor 37 is coupled to the source 35A of transistor 35 (of FIG. 4B). In alternative embodiments, the shielding can take other forms such as the cylindrical shape illustrated in FIG. 2.

Figure 4B:
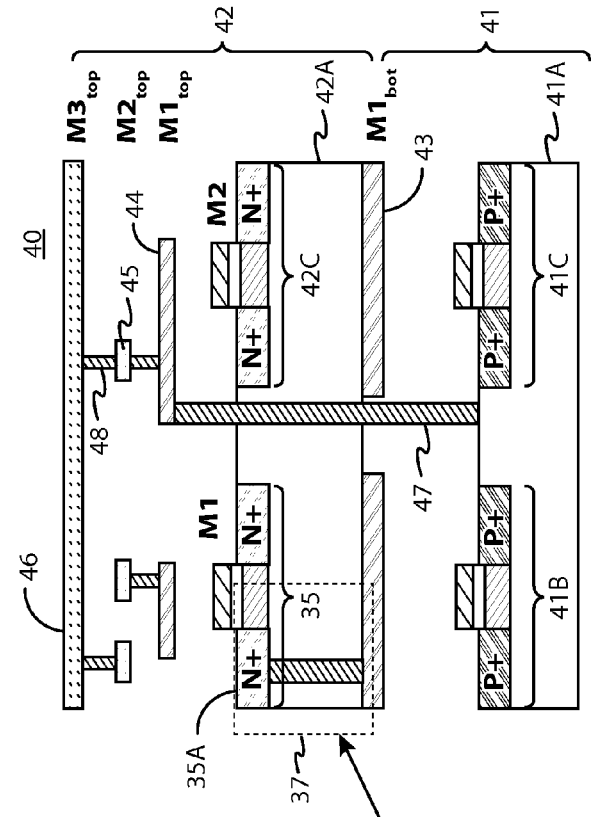
FIG. 4B is a cross sectional view of a 3-D shielded inductor implemented across multiple tiers of a 3-D integrated circuit according to an embodiment of the present disclosure.

FIG. 4B is a cross sectional view of the 3-D shielded inductor 37 implemented across multiple tiers of the 3-D integrated circuit 40 in accordance with some embodiments. A first tier 41 includes a substrate 41A having active devices 41B and 41C formed therein. In some embodiments, active devices 41B and 41C are PMOS transistors. Conductive traces are formed on a metallization layer 43 (e.g., M1 bottom) and in some embodiments form a portion of the inductors. A second tier 42 of 3-D integrated circuit 40 includes active devices 35 and 42C. In some embodiments, active devices 35 and 42C are NMOS transistors. Transistor 35 of FIG. 4B can correspond to transistor 35 of FIG. 3 where shielded inductor 37 is coupled between a source 35A of transistor 35 and the metallization layer 43 which can serve as ground. The second tier 42 can further include conductive traces formed on a metallization layer 44 (e.g., M1, M2, M3 of tier 42), and additional conductive traces on other metallization layers 45 and 46 (e.g., M1, M2, M3 of tier 42). The 3-D integrated circuit 40 further includes inter-tier vias such as via 47 coupling elements from the first tier 41 to the second tier 42. Local vias, such as local via 48, are also included in second tier 42.

Figure 5A:
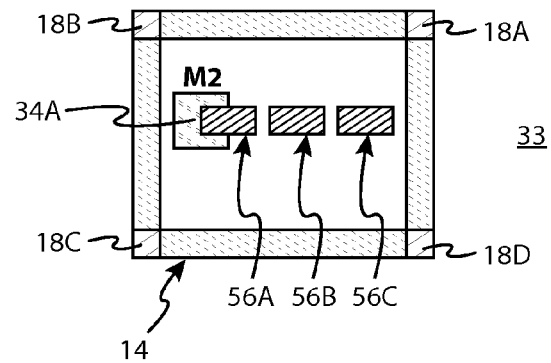
FIG. 5A is a partial top view of a shielded 3-D meandering-type inductor of a three-dimensional integrated circuit design in accordance with an embodiment of the present disclosure.
Figure 5B:
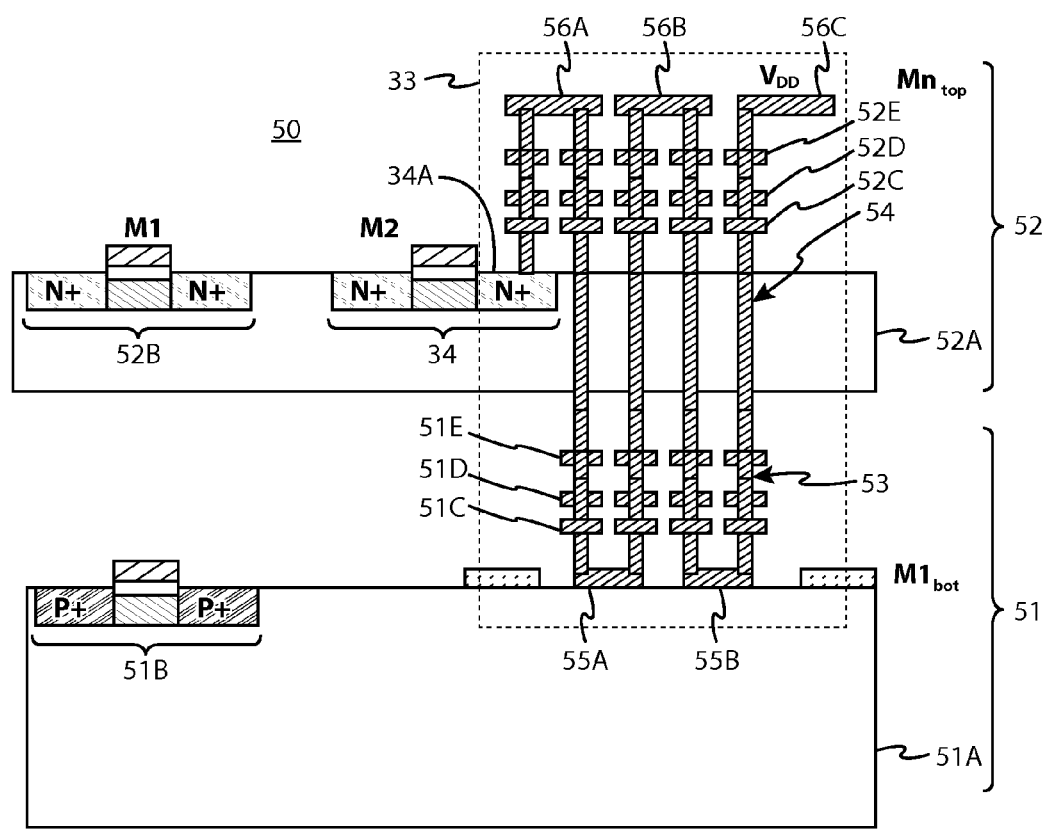
FIG. 5B is a cross sectional view of a 3-D integrated circuit including the shielded 3-D meandering-type inductor implemented across multiple tiers of the 3-D integrated circuit according to an embodiment of the present disclosure.

FIG. 5B illustrates a cross-sectional view of an integrated 3D IC 50 having a 3-D shielded inductor 33, and FIG. 5A illustrates a top view of a portion of the 3D IC 50 having the 3D shielded inductor 33. In some embodiments, 3D IC 50 has a bottom tier 51 with a substrate 51A and a second tier 52 including a second tier dielectric or silicon layer 52A formed above the single semiconductor substrate 51A. In some embodiments, semiconductor substrate 51A comprises silicon, a III-V semiconductor, an SOI substrate or the like. In some embodiments, the semiconductor substrate in the various embodiments can include an epitaxial layer (not shown). For example, the substrate can have an epitaxial layer overlying a bulk semiconductor. In other embodiments, the substrate can include stressor material regions for performance enhancement. For example, the epitaxial layer can include semiconductor materials having a lattice structure different from those of the bulk semiconductor such as a layer of silicon germanium overlying a bulk silicon, or a layer of silicon overlying a bulk silicon germanium formed by a process including selective epitaxial growth (SEG). Furthermore, the substrate can include a semiconductor-on-insulator (SOI) structure. In various examples, the substrate can include a buried oxide (BOX) layer formed by a process such as separation by implanted oxygen (SIMOX).

Each of layer 51 and 52 can also be considered a tier of the 3D IC 50. In some embodiments, each tier can include a substrate such as substrate 52A or a semiconductor (active device) layer. For example, substrate 51A is an active device layer having at least one active device 51B (e.g., transistor or diode) disposed on a surface of the active device layer 51, and an interconnect structure comprising plural conductive line layers (e.g., metal layers) 51C, 51D, and 51E above the substrate 51A. Similarly, the second tier or layer 52 has an active device layer 52 having at least one active device 52B disposed on a surface of the active device layer 52, and an interconnect structure comprising plural conductive line layers (e.g., metal layers) 52C, 52D, and 52E above the substrate 52A. In some embodiments, the substrate 52A is a thin semiconductor substrate joined to the top conductive line layer of the first layer 51. In some embodiments, an active device layer is disposed on a substrate 52A disposed above the surface of the tier 51. The second layer 52 can include an inter-layer dielectric of SiO, SiN, or SiON above the substrate 52A. Layer or tier 52 can comprise a semiconductor layer, or a semiconductor layer over a dielectric layer, in which case layer 52 can also include an active device 52B outside of the region containing the shielded inductor 33. In this example, the shielded inductor 33 is coupled to a drain 34A of an NMOS transistor 34, but other suitable devices can be included. For example, the 3D IC 50 can include various microelectronic devices such as a metal-oxide-semiconductor field effect transistor (MOSFET) including complementary MOSFET (CMOS), metal semiconductor field effect transistor (MESFET), imaging sensor including CMOS imaging sensor (CIS) or the like. The 3D IC 50 can include other suitable active and/or passive devices.

In some embodiments, the shielded inductor 33 can be a 3-D meandering-type inductor formed by multiple segments is illustrated in FIG. 5B. A meandering-type inductor is an inductor having a winding or indirect course rather than a straight path. In some embodiments, the multiple segments of shielded inductor 33 include the drain 34A, multiple local vias 53 between metallization layers ($M_{1-n}$), inter-tier vias 54 traversing through tiers 51 and 52 as well as top portions or segments 56A, 56B, and 56C of an nth metallization layer $M_n$ of a second tier 52 and bottom portions or segments 55A and 55B of a first metallization layer $M_1$.

Although not explicitly shown in FIG. 5B's cross sectional view, the shielding portions of the inductor 33 are illustrated in FIG. 5A, which is a top view illustrating an example of the shielding of the inductor 33. In some embodiments, 3D shielded inductor 33 includes rectangular metal ring 14 and conductive vias 18A-D. As shown in FIG. 5B, the 3-D shielded inductor 33 is coupled to the drain 34A of transistor 34. In some embodiments, the shielding can take other forms such as the cylindrical shape illustrated in the shielded inductor 20 of FIG. 2.

In some embodiments, the substrate 51A is a semiconductor wafer. In another embodiment, the substrate 51A is a semiconductor die. In an embodiment, the substrate 51A is a p-type substrate or an n-type substrate. In some embodiments, substrate 51A is formed from a material including, but not limited to, a Group IV elemental or compound semiconductor or a Group III-V semiconductor. The substrate 51A can include silicon. The substrate 51A can include another semiconductor such as, for example, germanium. The substrate 51A can also include a compound semiconductor such as, for example, silicon carbide, gallium arsenide, indium arsenide or indium phosphide. In some embodiments, the substrate includes multiple metallization layers within one or more tiers as shown in FIGS. 4B and 5B. In some embodiments having multiple metallization layers within a tier, the substrate includes two tiers or active device layers or includes 3 or more tiers or active device layers. Some embodiments can include multiple substrates (not shown).

Figure 6:
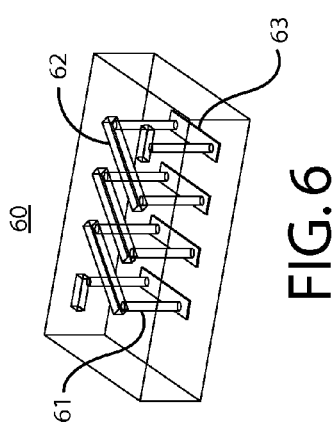
FIG. 6 is perspective view of a spiral inductor implemented as part of a 3-D inductor according to an embodiment of the present disclosure.

FIG. 6 is a perspective view of a 3D IC 60 having a 3-D inductor 60 in the form of a spiral or solenoid which crosses a plurality of tiers of the 3D IC 60. The tiers can be in a horizontal direction and/or a vertical direction across different tiers. In some embodiments, the 3-D inductor 60 is formed from conductors 63 on a metallization layer on a bottom tier and coupled to conductors 62 on a metallization layer on a top tier using a number of conductive inter-tier vias 61. The 3D IC 60 has a substrate (not shown) below the conductors 63 and a second tier dielectric layer (not shown) below the conductors 62 according to an embodiment of the present disclosure.

Figure 7:
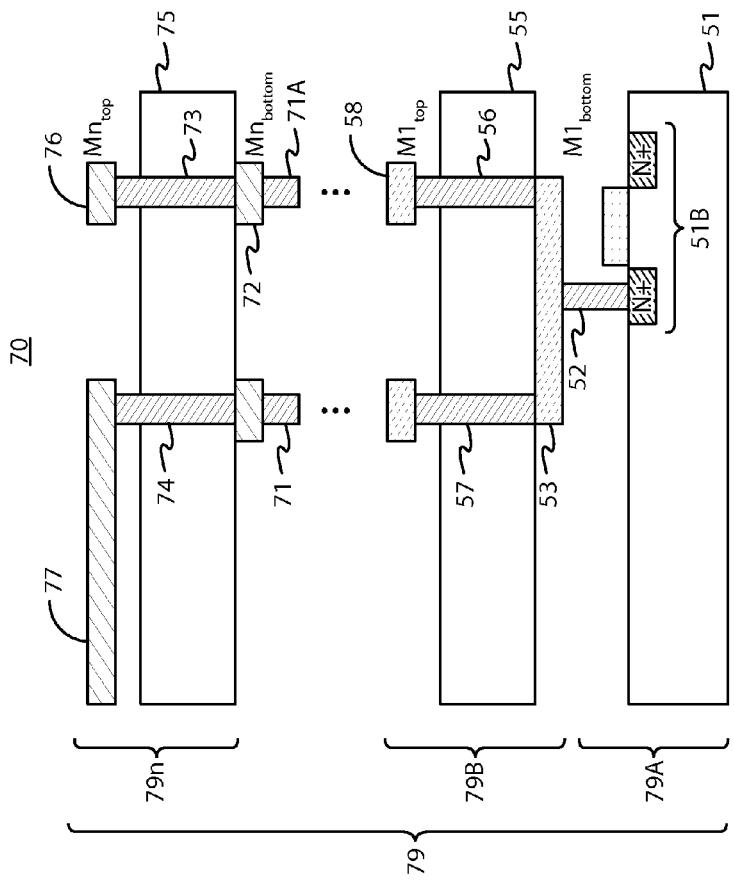
FIG. 7 is a cross sectional view of a 3-D inductor implemented in a first tier and a plurality of upper tiers over a single substrate with a plurality of intervening metallization layers and/or active device layers between the second tier dielectric layer and the top tier dielectric layer according to an embodiment of the present disclosure.

FIG. 7 is a cross-sectional view of a 3D IC 79 having n tiers (n>1) including a first tier 79A through an nth tier 79n, and including a 3D inductor 70. 3D Inductor 70 has a substrate 51, a dielectric layer 55 disposed above substrate 51 in a second tier 79B, and additional tiers up to an nth tier dielectric layer 75 in tier 79n. according to an embodiment of the present disclosure. As explained above, each dielectric layer can include an active device layer. For example, substrate 51 includes at least one active device 51B (e.g., transistor or diode) disposed at a surface of the substrate. Dielectric layer 55 can also include an active device layer having an active device therein (not shown) outside of the region containing inductor 70, and dielectric layer 75 can include an active device layer having an active device therein (not shown) outside of the region containing inductor 70. In some embodiments, the active device 51B is similar to transistor 52B shown in FIGS. 5, but has its drain coupled to inter-tier vias 57 and 56 through the local via 52 and the bottom portion 53 of the first metallization layer (M1).

The active device 51B is coupled to the top portions 76 and 77 of the nth metallization layer Mn through a series of connections that form inductive elements that form the 3-D inductor 70. For example, one inductive element includes local via 52, a portion of conductive line 53, inter-tier via 56, conductive line 58 (M1 top), a plurality of local vias (including local via 71A), conductive line 72 of metallization layer (Mn bottom), inter-tier via 73, and conductive line 76 (Mn top). Another inductive element includes local via 52, a portion of conductive line 53, inter-tier via 57, conductive line 58 (M1 top), a number of local vias including local via 71, conductive line 72 (Mn bottom), inter-tier via 74, and conductive line 77 of metallization layer (Mn top). Thus, in some embodiments, the inductive elements of a 3-D inductor can include local vias, conductive lines in up to n metallization layers, and a plurality of inter-tier vias.

Figure 8:
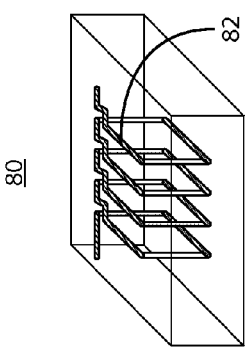
FIG. 8 is perspective view of another spiral or solenoid inductor implemented as part of a 3-D inductor according to an embodiment of the present disclosure.

FIG. 8 illustrates another perspective view of a 3D IC 80 having a 3D inductor 82 in the form of a spiral or solenoid or toroid which crosses a plurality of tiers of the 3D IC 80. In some embodiments, the tiers are disposed in a horizontal direction and/or a vertical direction across different tiers. The 3-D inductor 80 includes multiple conductors including conductors 82 on one or more metallization layers and using a number of conductive inter-tier vias as previously described.

Figure 9:
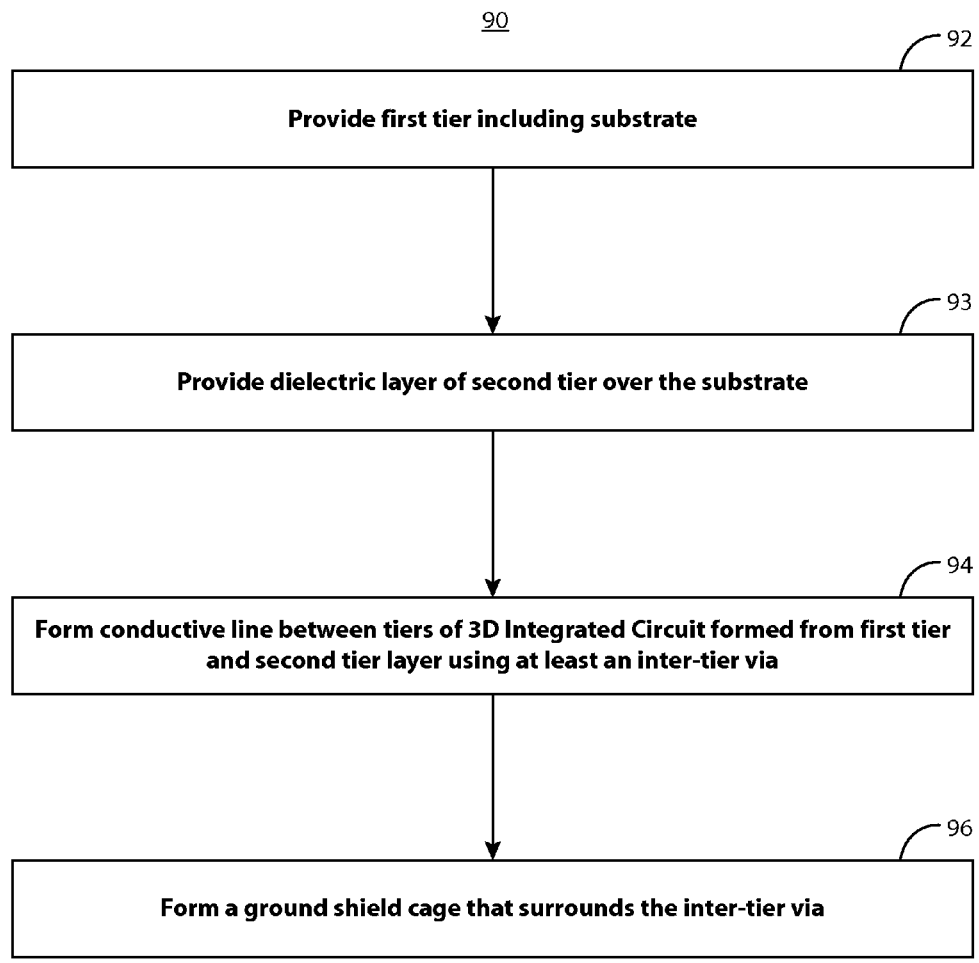
FIG. 9 is a flow chart illustrating a method of forming a 3-D shielded inductor according to an embodiment of the present disclosure.

As described above, the 3D IC's in FIGS. 4B, 5B, and 7 can have multiple layers or tiers. Subsequent processing steps can add one or more additional tiers or layers above the layers shown, prior to completion of the IC fabrication. FIG. 9 is a flow chart illustrating one example of a method 90 of forming a 3-D shielded inductor according to an embodiment of the present disclosure. At step 92, a first tier dielectric including a substrate is provided. In some embodiments, the substrate has a first active device layer disposed at a surface of the substrate.

At step 93, a second tier dielectric layer is disposed above the first active device layer, and one or more openings extend completely through the second tier dielectric layer. Conductive material is applied in at least one of the plurality of the openings to form an inductive element portion. The inductive element portion can be an inter-tier via. The inter-tier via can extend completely through an upper tier dielectric layer of at least one of the upper tiers of a multi-tiered 3D IC. In some embodiments, at least one upper tier via extends completely through the upper tier dielectric layer and the interconnect (via and conductive line) layers of at least one of the upper tiers of the 3D IC.

The openings described above can be formed by any suitable method. The openings can be local vias, inter-tier vias, or through substrate vias. The openings can be formed by anisotropic etching, such as a dry etch. The openings can be exposed from the backside of a substrate and through the second surface by, for example, a backside polishing process such as chemical mechanical polishing (CMP) to planarize the second surface and thin the substrate. In some embodiments, the openings can have substantially straight side walls.

For example, openings can be formed with sidewalls perpendicular to a first surface and second surface. In an alternative embodiment, openings are formed using a process having partial anisotropic etching and partial isotropic etching such that openings include a predetermined tapered profile. The openings can have different geometries and dimensions for tailored performance in various embodiments.

At step 94, conductive lines are formed between tiers of a 3D IC formed from the substrate and the second tier dielectric layer using at least the inter-tier via. In some embodiments, this step is performed before the second tier dielectric layer is formed above the substrate. Thus, the conductive lines are formed above a first active device layer, before depositing the second tier dielectric layer above the conductive lines. Step 94 can be performed using back end of line processing techniques, such as dual damascene processes.

At step 96, a ground shield cage is formed that surrounds the inter-tier via. In some embodiments, the ground shield cage can take the form of a rectangular-shaped cage or a hollow cylindrical cage as explained above with respect to FIGS. 1 and 2. Of course, the ground shield cage can form other shapes suitable for the configuration of the 3D IC and the corresponding inductor portion that the cage is shielding.

The conductive material applied to the surface of the openings to form conductive vias can include copper, aluminum, or other conductive material. The conductive material can be filled in the opening using any suitable process including, but not limited to, electro plating, chemical vapor deposition (CVD), physical vapor deposition (PVD), sputtering, or the like. In some embodiments, a conformal diffusion barrier layer (not shown) can be formed, covering the sidewalls and bottom of the openings. For example, diffusion barrier layer (of TiN, TaN, or the like) can be formed using physical vapor deposition (PVD). In some embodiments, a seed layer (not shown), which can include copper, can be formed on diffusion barrier layer (not shown) by, for example, electroless plating. As discussed above, the second surface can be polished by using for example, CMP, to expose the TSV. In another embodiment, the TSV can be exposed using a back etching process.

The embodiments herein can use any of the techniques described above for example or other suitable 3D integration technique to form the 3-D circuit shown in FIGS. 1-8.

In some embodiments, the three dimensional (3D) circuit includes a first tier including a semiconductor substrate, a second tier disposed adjacent to the first tier, a 3D inductor including an inductive element portion including a conductive via extending from the first tier to a dielectric layer of the second tier disposed, and a ground shield surrounding at least a portion of the conductive via. In some embodiments, the ground shield includes a hollow cylindrical cage or a rectangular cage. In some embodiments, inductive element portion comprises an inter-tier via. In some embodiments, the conductive vias include one or more of local vias, inter-tier vias, or through silicon vias or TSVs. In some embodiments, the inductive element portion comprises a plurality of inter-tier vias that traverse a number of tiers of a 3D integrated circuit. In some embodiments, the inductive element portion forms a 3-D spiral inductor and in some embodiments the 3-D spiral inductor traverses at least two or more tiers of a multi-tier 3D integrated circuit. In some embodiments, the 3D inductor includes at least one first conductive line formed above the second tier dielectric layer where the at least one first conductive line couples to the conductive via. In some embodiments, the 3D inductors includes at least one second conductive line formed above the first active device layer where the at least one second conductive line couples to the conductive via. In some embodiments, inductive element portion comprises at least one first and at least one second conductive lines included in a metallization layer between the substrate and the second tier dielectric layer. In some embodiments, the inter-tier via forms above the semiconductor substrate where the inter-tier via couples to at least one conductive line in two or more conductive line layers of the semiconductor substrate. In some embodiments, the inter-tier via forms a source inductor for a low noise amplifier circuit. In some embodiments the inductive element portion forms a 3-D meandering type inductor. In some embodiments, the 3D inductor forms a portion of a radio frequency circuit providing one of source inductive degeneration, impedance matching, gain peaking for a low noise amplifier or equalization. In some embodiments, the ground shield includes a rectangular cage formed from a top conductive ring and a bottom conductive ring and at least two or more conductive vias coupling the top conductive ring and the bottom conductive ring.

In some embodiments, an integrated circuit includes a first tier including a semiconductor substrate including a first active device layer formed therein and at least a second tier including a dielectric layer disposed above the first active device layer, an inductive element portion including a conductive via extending completely through the dielectric layer and a ground shield surrounding at least a portion of the inductive element portion using at least a second conductive via and a third conductive via coupled to a ground. In some embodiments the conductive via includes one or more of local vias, inter-tier vias, and through silicon vias. In some embodiments, the conductive via comprises at least one inter-tier via.

In some embodiments, a method of forming a 3D inductor includes providing a first tier including at least one substrate having a first active device layer disposed at a surface of the at least one substrate, providing at least a second tier including a dielectric layer disposed above the first active device layer, forming an opening extending completely through the dielectric layer, applying conductive material in the opening to form an inductive element portion, and forming a ground shield cage using additional conductive vias surrounding the opening and coupled to a ground. In some embodiments, the ground shield cage is formed from further using a top round or rectangular ring formed from conductors disposed above the dielectric layer and a bottom round or rectangular ring formed from conductors disposed below the dielectric layer where the top ring is coupled to the bottom ring using the additional conductive vias surrounding the opening.

While numerous embodiments of the present invention have been described, it is to be understood that the embodiments described are illustrative only and that the scope of the claims is to be defined by the appended claims when accorded a full range of equivalents, many variations and modifications naturally occurring to those of skill in the art from a perusal hereof.

Furthermore, the above examples are illustrative only and are not intended to limit the scope of the disclosure as defined by the appended claims. It will be apparent to those skilled in the art that various modifications and variations can be made in the varactors, integrated circuits and methods of the present subject matter without departing from the spirit and scope of the disclosure. Thus, it is intended that the claims cover the variations and modifications that can be made by those of ordinary skill in the art.

What is claimed is:

1. A three dimensional (3D) circuit, comprising:
a first tier including a semiconductor substrate;
a second tier disposed vertically adjacent to the first tier;

a 3D inductor including an inductive element portion, the inductive element portion comprising a conductive via extending from the first tier to a dielectric layer of the second tier; and a ground shield arranged laterally around at least a portion of the conductive via and extending vertically from the first tier to the second tier.

2. The 3D circuit of claim 1, wherein the ground shield includes a hollow cylindrical cage that is arranged laterally around the portion of the inductive element portion and comprises a top round ring, a bottom round ring and a plurality of vias extending between the top round ring and the bottom round ring and arranged around the conductive via.

3. The 3D circuit of claim 1, wherein the conductive via comprises an inter-tier via.

4. The 3D circuit of claim 3, wherein inter-tier via forms a source inductor for a low noise amplifier circuit.

5. The 3D circuit of claim 1, wherein the conductive via comprises one or more of local vias, inter-tier vias, or through silicon vias.

6. The 3D circuit of claim 1, wherein the inductive element portion comprises a plurality of inter-tier vias that traverse a plurality of tiers of the 3D integrated circuit.

7. The 3D circuit of claim 6, wherein each of the plurality of inter-tier vias is disposed above the semiconductor substrate and coupled to at least one conductive line in two or more conductive line layers of the first tier.

8. The 3D circuit of claim 6, wherein the inductive element portion forms a 3-D spiral inductor, including a plurality of conductive lines formed above the dielectric layer and a plurality of conductive lines formed below the dielectric layer.

9. The 3D circuit of claim 8, wherein the 3-D spiral inductor traverses at least two or more tiers of a multi-tier 3D integrated circuit.

10. The 3D circuit of claim 1, comprising at least one first conductive line formed above the dielectric layer, the at least one first conductive line coupled to the conductive via.

11. The 3D circuit of claim 10, comprising at least one second conductive line formed above the first active device layer, the at least one second conductive line coupled to the conductive via.

12. The 3D circuit of claim 1, wherein inductive element portion comprises at least one first and at least one second conductive lines included in a metallization layer between the substrate and the second tier dielectric layer.

13. The 3D circuit of claim 9, wherein the inductive element portion forms a 3-D meandering type inductor including a plurality of conductive lines formed above the dielectric layer and a plurality of conductive lines formed below the dielectric layer.

14. The 3D circuit of claim 1, wherein the 3D inductor forms a portion of a radio frequency circuit providing one of source inductive degeneration, impedance matching, gain peaking for a low noise amplifier or equalization.

15. The 3D circuit of claim 1, wherein the ground shield includes a cylindrical cage formed of a top round conductive ring and a bottom round conductive ring and two or more conductive vias coupling the top round conductive ring and the bottom round conductive ring.

16. An integrated circuit, comprising:

a plurality of tiers including a first tier including a semiconductor substrate including a first active device layer formed therein and a second tier including a dielectric layer disposed above the first active device layer;

a 3-D spiral inductor that traverses two or more of the plurality of tiers of the integrated circuit and includes a plurality of conductive lines formed above the dielectric layer, a plurality of conductive lines formed below the dielectric layer and a plurality of conductive vias extending vertically and coupling the plurality of conductive lines formed above the dielectric layer to the plurality of conductive lines formed below the dielectric layer; and a ground shield arranged laterally around at least a portion of the inductive element portion using at least two further conductive vias coupled to a ground and extending vertically from the first tier to the second tier.

17. The integrated circuit of claim 16, wherein the plurality of conductive vias comprise one or more of local vias, inter-tier vias, or through silicon vias.

18. The integrated circuit of claim 17, wherein the 3-D spiral inductor comprises at least one inter-tier via.

19. A method of forming a three dimensional (3D) inductor, comprising:

providing a first tier including at least one substrate having a first active device layer disposed at a surface of the at least one substrate;

providing at least a second tier including a dielectric layer disposed above the first active device layer;

forming a 3-D meandering type spiral inductor that traverses at least the first and second tiers and includes a plurality of conductive lines formed above the dielectric layer, a plurality of conductive lines formed below the dielectric layer and a plurality of vertically extending vias that couple the plurality of conductive lines formed above the dielectric layer to the plurality of conductive lines formed below the dielectric layer;

and forming a ground shield cage using a top round ring formed from conductors disposed above the dielectric layer, a bottom round ring formed from conductors disposed below the dielectric layer, and additional conductive vias arranged laterally around the 3-D meandering type spiral inductor, each of the additional conductive vias extending from the top round ring to the bottom round ring and coupled to a ground.

* * * * *